INVENTORS
A. I. F. SIMPSON
W. A. CAWTHRA

INVENTORS
A. I. F. SIMPSON
W. A. CAWTHRA

Aug. 20, 1963 A. I. F. SIMPSON ET AL 3,101,453
TRANSISTOR AMPLIFIERS WITH PROTECTIVE CIRCUIT MEANS
Filed Jan. 21, 1958 5 Sheets-Sheet 3

INVENTORS
A.I.F. SIMPSON
W. A. CAWTHRA

INVENTORS
A. I. F. SIMPSON
W. A. CAWTHRA

INVENTORS
A. I. F. SIMPSON
W. A. CAWTHRA

United States Patent Office 3,101,453

Patented Aug. 20, 1963

3,101,453

TRANSISTOR AMPLIFIERS WITH PROTECTIVE CIRCUIT MEANS

Arthur Ian Forbes Simpson and William Alexander Cawthra, both of London, England, assignors to Modern Telephones (Great Britain) Limited, London, England, a British company Filed Jan. 21, 1958, Ser. No. 710,232

Claims priority, application Great Britain Jan. 21, 1957

2 Claims. (Cl. 330—22)

Figure 1:
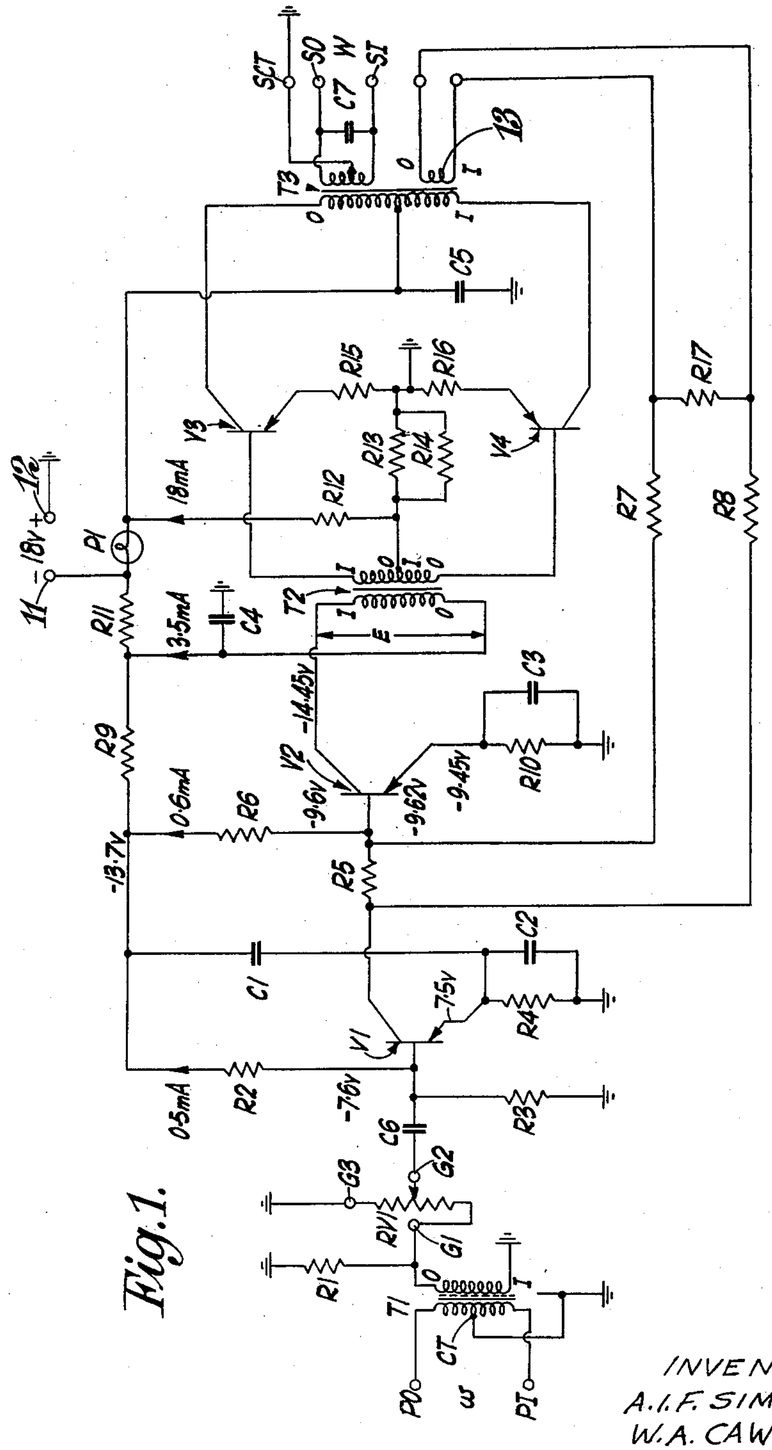

This inventon relates to multi-stage transistor amplifiers and is more particularly concerned with such amplifiers for amplifying speech signals. By a multi-stage transistor amplifier is meant one having two or more transistor stages.

In a transistor amplifier, if an adequate life is to be expected of the transistors, the mean dissipation in each transistor must not exceed some known amount. It is a property of transistors, however, that provided input pulses are short compared with the thermal time constant of the transistor, the transistor can handle input pulses of power over a short duration far in excess of the possible power handling capacity for a continuous signal. The present invention makes use of this property and provides a multi-stage transistor amplifier for amplifying speech signals, in which the peak output signal from one of its stages (for a corresponding peak input signal, to the amplifier) is greater than the maximum continuous input signal of the following stage permitted by the power dissipation limits of the said following stage but is within the peak handling capacity of the said following stage for amplification without appreciable distortion. Preferably the said following stage is the last stage of the amplifier.

The distribution of energy in speech can be determined empirically and, as a first approximation may be assumed to be a gaussian distribution. From such a distribution it is possible to calculate the deviations and hence the probability of the ratio of the peak level to mean level exceeding any given value. Preferably the said following stage is capable of handling an instantaneous power level (i.e. a power level for a duration which is short compared with the thermal time constant of the transistor or transistors of that stage) of at least twenty times the maximum mean power level (for signals of extended duration) determined by the dissipation limits of that stage.

Since the amplifier would not handle a continuous input of the peak power level which might be applied to the last stage, a protective circuit is preferably provided for protecting the amplifier or at least the said following stage thereof against any input signal of a given amplitude having a duration appreciably exceeding the maximum expected duration of an input speech signal of that amplitude. This protective circuit may with advantage be arranged to reduce the voltage of the power supply to the amplifier or to at least the said following stage thereof and, in a preferred arrangement, the protective circuit comprises a non-linear resistor, for example a tungsten filament lamp, having a resistance which increases with current, this resistor being connected in series with a supply lead; and a capacitor being provided in shunt across the amplifier power input supply circuit on the amplifier side of said non-linear resistor. With this arrangement the capacitor will ensure a substantially constant input supply voltage during short peaks of speech signals when the amplifier tends to draw a heavy current from the supply but, if a high level input signal is prolonged so that the amplifier tends to draw a heavy current for a relatively long period, the increased resistance of the non-linear resistor will reduce the incoming supply voltage so that the voltage applied to the amplifier will gradually fall as the capacitor discharges.

Figure 2:
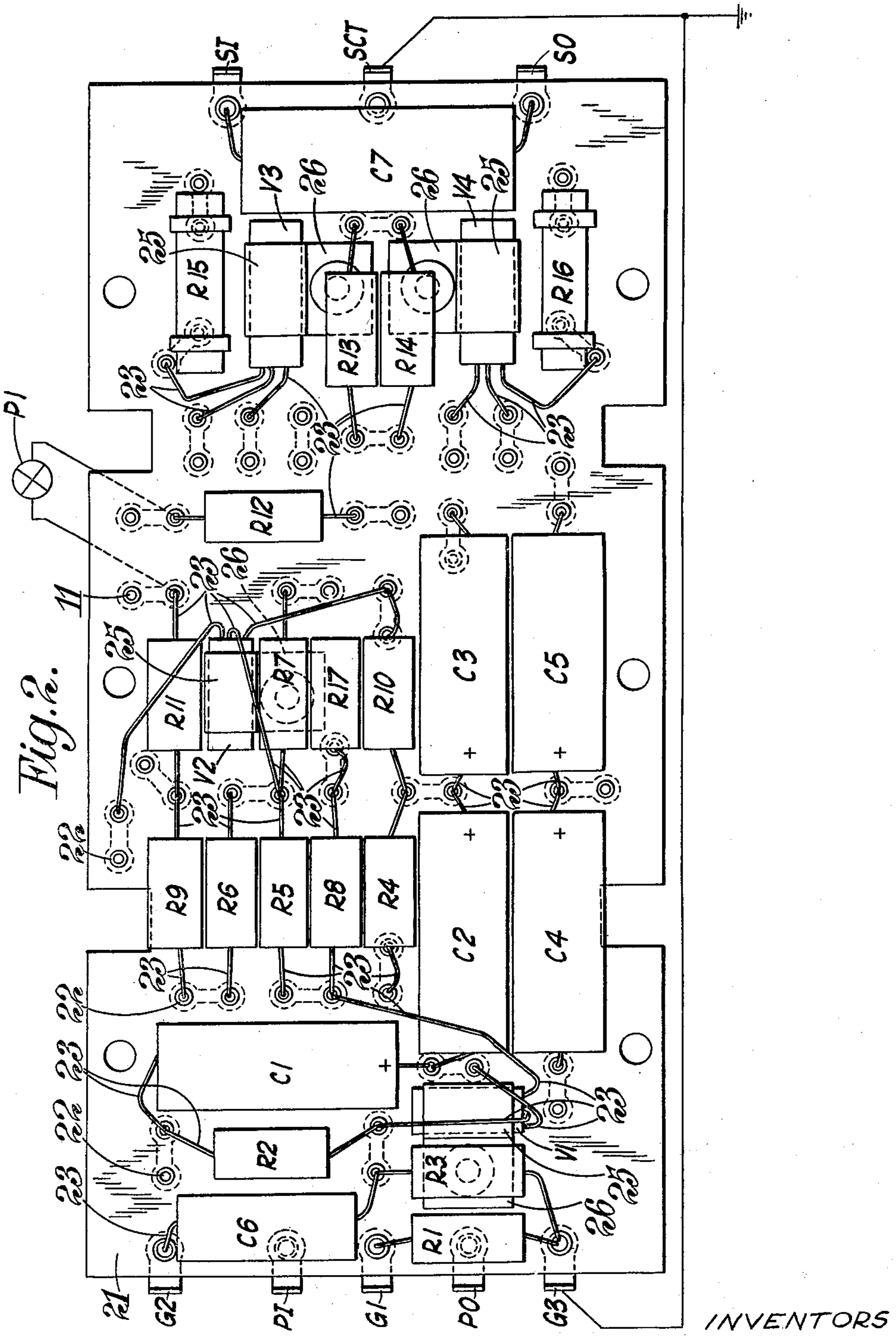
Figure 3:
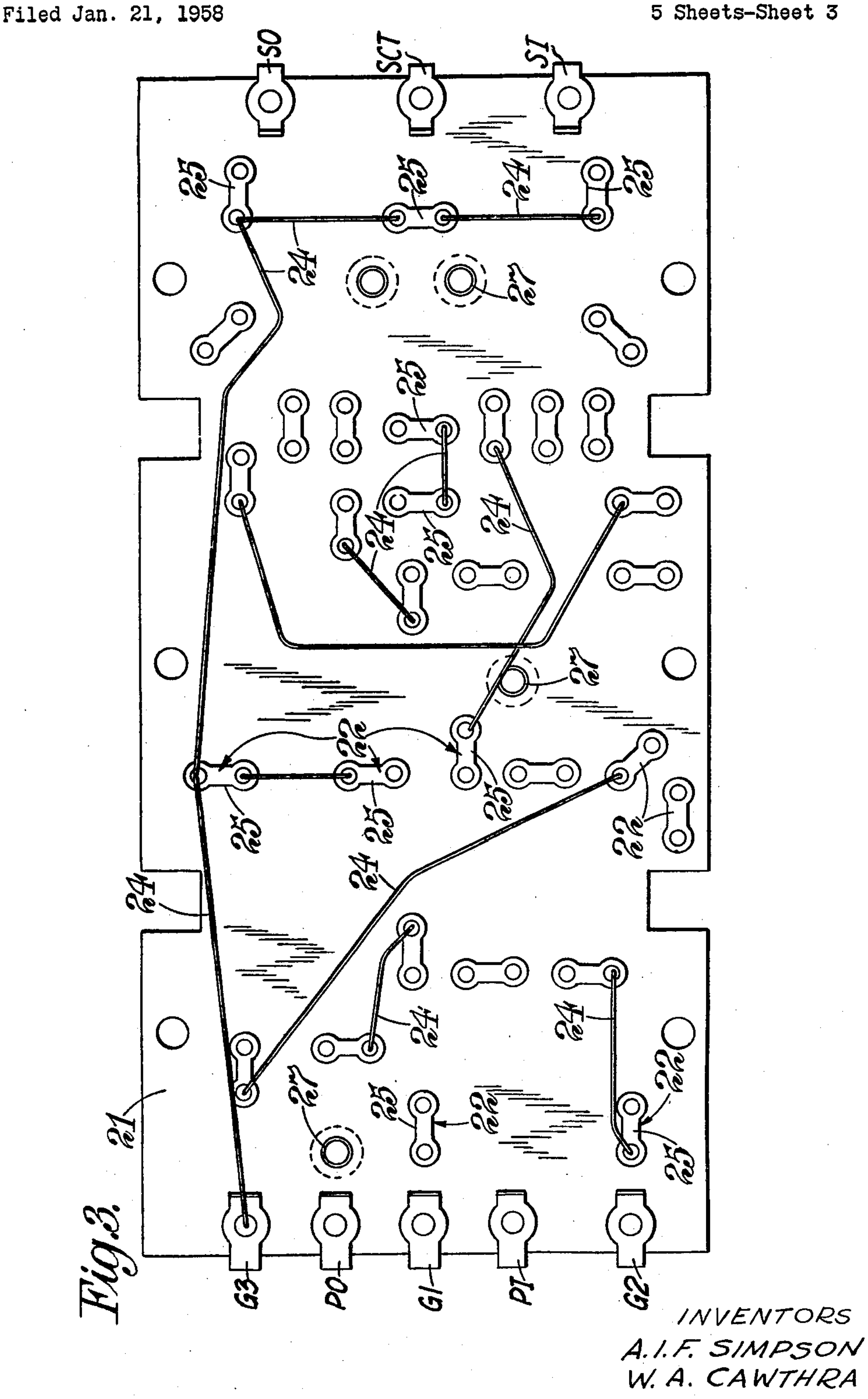
Figure 4:
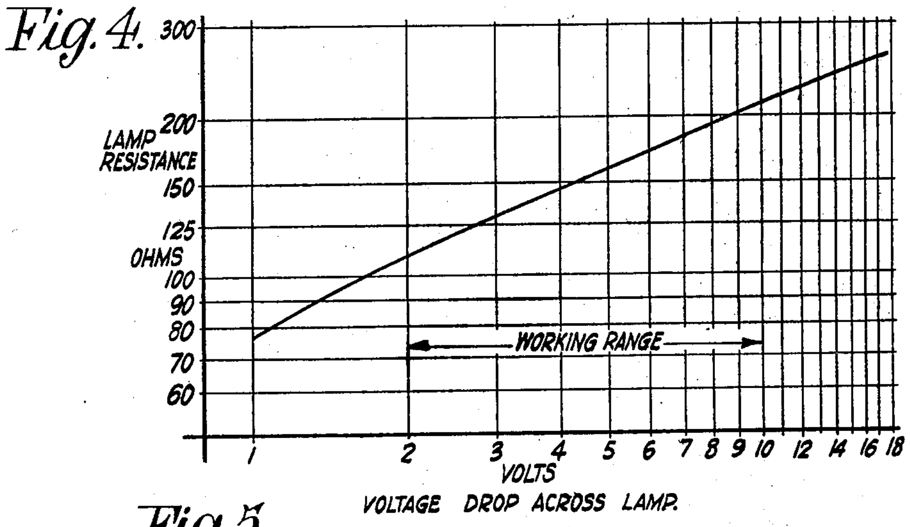
Figure 5:
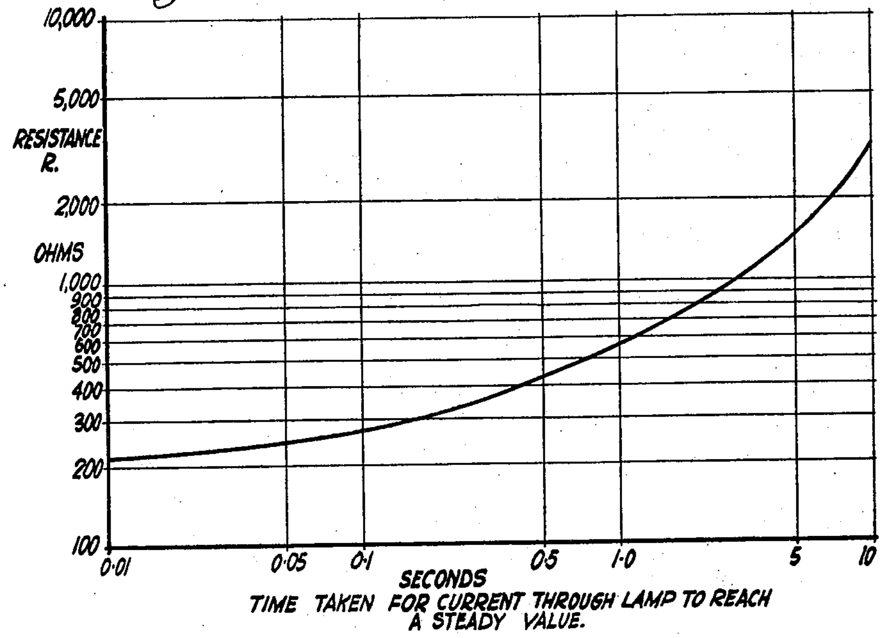
Figure 6:
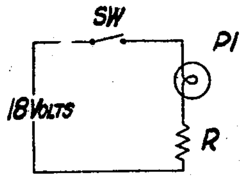
Figure 7:
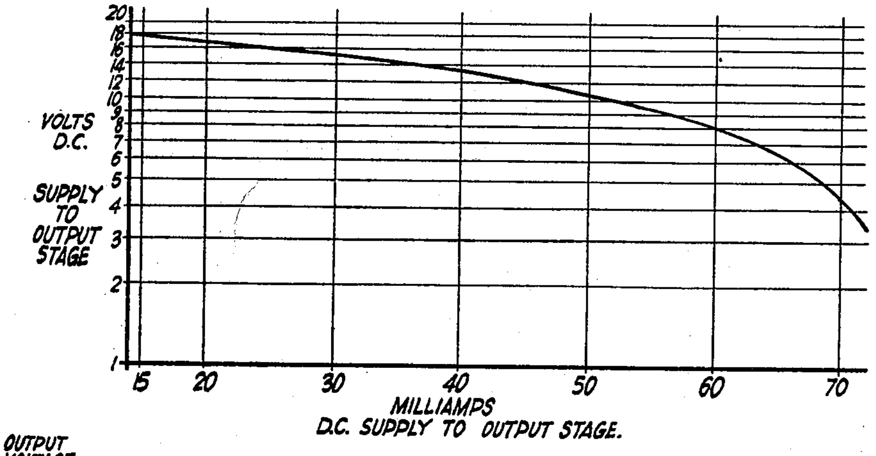
Figure 8:
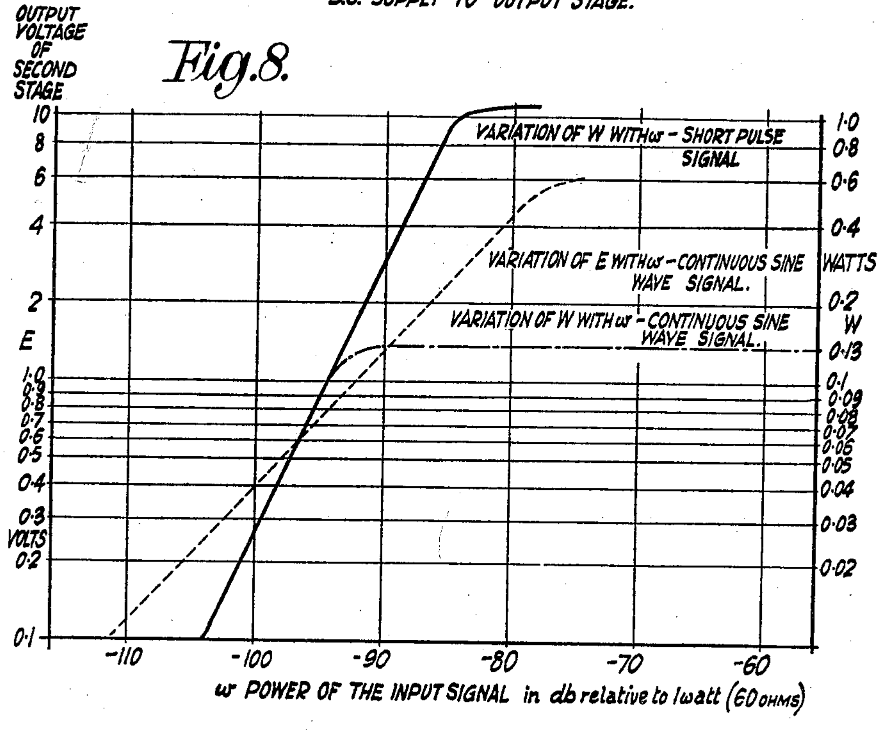

A specific amplifier embodying the invention will now be described by way of example and with reference to the accompanying drawings, in which, FIGURE 1 is a circuit diagram of the amplifier, FIGURE 2 shows an electrical circuit assembly forming part of the amplifier, FIGURE 3 shows the under side of that circuit assembly, FIGURES 4 and 5 show characteristics of the lamp P1 employed in the circuit, FIGURE 6 shows the circuit to which the graph of FIGURE 5 relates, FIGURE 7 shows the voltage/current characteristic of the D.C. supply to the output stage, and FIGURE 8 shows the variation of the output power with variation in input signal, for a short pulse signal and for a continuous sine wave signal, and also shows the variation of the output voltage of the second stage with variation in input signal.

In this example the amplifier includes four junction type transistors V1, V2, V3 and V4. The transistors V1 and V2, together with their associated circuit elements, constitute two amplifying stages. The transistors V3 and V4, together with their associated circuit elements constitute a push-pull output stage. The terminals 11, 12 are connected to an 18 volt D.C. power supply with the polarity indicated, and the values of various voltages and currents in various parts of the circuit when it is in its quiescent condition i.e. with zero input signal, are indicated in FIGURE 1. The input signal is connected to the terminals PI, PO by a twisted pair of insulated conductors and is fed through the input transformer T1, the gain control potentiometer RV1 and capacitor C6 to the base of the transistor V1. The output from the collector of transistor V1 is fed through the resistor R5 to the base of the transistor V2. The output from the collector of transistor V2 is fed through the inter-stage coupling transformer T2 to the bases of the transistors V3, V4. The output from the collectors of the transistors V3, V4 is connected through the output transformer T3 to the output terminals SI, SO and the loudspeaker or other load is connected to those terminals by a twisted pair of insulated conductors. In this example, the amplifier is designed to be fed from a source having an impedance of 60 ohms and to feed a load having an impedance of 60 ohms. The inner and outer ends of the various transformer windings are indicated respectively by the reference letter I and O.

The output transformer T3 has a feedback secondary winding 13 which is connected to the resistor R5 through the resistor network R7, R8, R17. The degenerative feedback voltage is thus developed across the resistor R5, which is in series with the input line to the base of transistor V2. This feedback increases the effective impedance of the load on the stage V1 and thus enables a greater output to be obtained from that stage. The overall power gain of the amplifier in this example is 80 decibels, of which a large proportion is due to the first stage being followed by a relatively high impedance as aforesaid.

That feedback arrangement forms the subject of copending U.S. application Serial No. 710,233, now Patent No. 3,008,092.

The output stage operates in Class B so that its demand from its power supply is substantially proportional to the power output of that stage.

A tungsten filament lamp P1 has a resistance which increases with the current through it and, as may be seen from FIGURE 1, it is connected in series with the power supply lead from the terminal 11 to the output stage. The capacitor C5 is connected in shunt across the power input supply circuit on the output stage side of the lamp P1. The capacitor C5 ensures a substantially constant input supply voltage to the output stage during short peaks of speech signals when the amplifier tends to draw a heavy current from the supply but, if a high level input signal is prolonged so that the amplifier tends to draw a heavy current for a relatively long period, the resulting increased resistance of the lamp P1 will reduce the supply voltage of the output stage so that the supply voltage applied to that stage will gradually fall, to the values indicated in FIGURE 7, as the capacitor C5 discharges.

The charactreistics of the lamp P1 are shown in FIGURES 4 and 5. The graph of FIGURE 5 was drawn from data obtained by estimating or measuring the time taken for the current in the lamp to become steady after the switch SW is closed, for successively different values of R, employing the test circuit shown in FIGURE 6.

The energy available from the capacitor C5 when it discharges from, say 17 to 15 volts is 800 watt microseconds. As the average voltage of that capacitor during that discharge is 16 volts, that discharge provides 50 milliamp. milliseconds. The pulse width of the random peaks of a typical speech wave form is centred on a value of about 0.25 millsecond. Consequently the particular discharge of the capacitor C5 from 17 to 15 volts, considered above by way of example, corresponds to an instantaneous peak current of about 120 milliamps. for isolated peaks. The maximum dissipation rating of the transistors V3 and V4 in this example when employed with pulses is 125 milliamps. mean current over a period of 20 milliseconds, with a maximum of 250 milliamps. for a period which is short with respect to 20 milliseconds. The characteristics of the amplifier of this example are such that it effectively reduces the dissipation of the transistors V3 and V4 to within their continuous dissipation rating whenever the input to the amplifier consists of a pulse of longer than about 10 milliseconds.

FIGURE 8 shows the relationships between the output voltage E of the second stage (which voltage appears across the primary winding of the transformer T2), the output power W provided at the output terminals SO, SI, and the power of the input signal applied to the input terminals PO, PI. It will be seen from FIGURE 8 that when the input $w$ is in the form of a short pulse signal, the output power W varies linearly with $w$ for inputs up to about −85 decibels, and that the variation of W with $w$ under those conditions is such that W does not exceed about 1.1 watts for a value of $w$ as great as about −78 decibels. That is within the handling capacity of the transistors V3 and V4 for short pulses. It will further be seen from FIGURE 8 that when the input $w$ is in the form of a continuous sine wave signal of audio-frequency, the output power W varies linearly with $w$ for values of $w$ up to about −95 decibels, but that for greater values of $w$ the value of W does not exceed about 0.13 watt. This is within the handling capacity of the transistors V3, V4 for continuous signals. It will also be seen from FIGURE 8 that E varies substantially linearly with $w$ for continuous sine wave signals and this substantially holds also for short pulse signals.

The characteristics of speech are such that the speech input signals applied to the terminals PO, PI contain components of short pulse form and components of sine wave form and the power dissipation limits of the transistors V3 and V4 are not exceeded in either case. It will be seen that the amplifier can handle short pulse signals for values of $w$ of between about −95 and −78 decibels with consequent values of W greater than 0.13 watt. This corresponds to an increased power gain of up to about 50 for such signals.

Thus, whilst the mean dissipation of the output stage is within the continuous power handling characteristics of that stage, the peak signal input to the output stage, whilst within the peak handling capacity of that stage for amplification without appreciable distortion, is substantially greater than the signal level of the maximum continuous signal which can be handled by the output stage without exceeding the power dissipation limits of that stage. The output stage is capable of handling an instantaneous power level which is about 50 times the mean power level which is determined by the dissipation limits of the output stage. The protective circuit P1, C5 protects the output stage against any prolonged excessive input signal.

The variation in brightness of the lamp during use of the amplifier gives an indication of the amplitude of modulation and can be used as a guide in setting the gain control RV1 for correct operation of the amplifier. The gain control RV1 is correctly set when, with a speech signal input to the amplifier, the lamp P1 is normally of a medium red appearance but occasionally comes to full brightness.

The circuit elements of FIGURE 1, with the exception of the transformers T1, T2, T3, the potentiometer RV1 and the lamp P1, are embodied in the circuit assembly shown in FIGURES 2 and 3. That assembly comprises a plate of insulating material 21 having secured thereon a large number of multiple metal eyelet units 22 to which the connecting wires 23 of the various circuit elements, and other connecting wires 24 are soldered. Each of the multiple metal eyelet units 22 comprises two eyelets having their heads connected by an integral bridge 25. These eyelets extend through holes preformed in the insulating plate 21 and are "eyeleted" or turned over at the ends which protrude through the upper face of the plate 21. The transistors V1, V2, V3, V4 are supported by sleeves 25 having flanges 26 which are secured to the insulating plate 21 by eyelets 27. The terminals PI, PO, G1, G2, G3, SI, SO, SCT are provided as tags secured to the insulating plate 21. Those tags are in the form of eyelets having suitable shaped tag heads.

The transformers T1, T2, T3, the lamp P1, the potentiometer RV1 and the power supply are connected to the circuit assembly shown in FIGURES 2 and 3 by means of flying leads soldered to the appropriate eyelets and tags.

The above described assembly forms the subject of British co-pending application No. 2,081/57.

Details of the various circuit elements are as follows:

| | |
|---|---|
| V1 | Transistor Type OC71. |
| V2 | Do. |
| V3 | Transistor Type OC76 or OC72. |
| V4 | Do. |
| R1 | 6,800 ohms±20% Erie Type 9. |
| R2 | 13,000 ohms±5% Erie Type 9. |
| R3 | 16,000 ohms±5% Erie Type 9. |
| R4 | 12,000 ohms±10% Erie Type 9. |
| R5 | 330 ohms±10% Erie Type 9. |
| R6 | 6,800 ohms±10% Erie Type 9. |
| R7 | 2,200 ohms±10% Erie Type 9. |
| R8 | Do. |
| R9 | 1,200 ohms±10% Erie Type 9. |
| R10 | 2,700 ohms±10% Erie Type 9. |
| R11 | 680 ohms±10% Erie Type 9. |
| R12 | 820 ohms±10% Erie Type 9. |
| R13 | 15 ohms±10% Erie Type 9. |
| R14 | Do. |
| R15 | 1.7 ohms±5% N.S.F. ½ watt. |
| R16 | Do. |
| R17 | 1,500 ohms±20% Erie Type 9. |
| RV1 | Potentiometer 20,000 ohms, semi-log type. |
| C1 | 25 microfarads, 25 volts working, Plessey Type CE 200. |
| C2 | Do. |
| C3 | Do. |
| C4 | Do. |
| C5 | Do. |

| | |
|---|---|
| C6 | 0.1 microfarad, 150 volts working, Dubilier Type 410. |
| C7 | Do. |
| T1 | Input transformer; voltage step-up ratio 7.7:1; primary centre-tapped. |
| T2 | Inter-stage transformer; voltage step-down ratio 2.5:1. |
| T3 | Output transformer voltage step-down ratio 1:1.75 for each half of the output winding with respect to each half of the primary winding; and voltage step-up ratio of 4:1.75 for the feedback winding **13** with respect to each half of the primary winding. |
| P1 | Tungsten filament lamp, 8 volts 50 milliamps. |

The amplifier of this example finds particular application as a speech amplifier in intercommunication telephone and paging systems where, by using this amplifier the size of the equipment and power supply circuits therefor may be considerably reduced compared with equipment in which the last stage of the amplifier is made capable of handling continuous signals of the maximum expected peak level and furthermore, the amplifier of this example uses types of transistors which are now readily available and avoids the use of very expensive high-power rating transistors.

The invention is not restricted to the details of the foregoing example.

I claim:

1. A multi-stage transistor amplifier comprising first and second transistor amplifier stages with coupling means for feeding signals amplified by the first stage to the second stage for further amplification, said first stage having such gain that the output signal from the first stage for a peak input signal is of greater amplitude than the maximum continuous input signal which can be handled by said second stage due to the power dissipation limits of said second stage but within the peak handling capacity of said second stage for amplification without appreciable distortion, a power supply for supplying operating potential to said first and second stages, a protective circuit including a resistance element having a positive temperature coefficient of resistance connected in series between the output of said second stage and said power supply for protecting said second stage against any input signal of a given amplitude having a duration exceeding the permissible duration for such a signal due to the dissipation limits of said second stage, said protective circuit further including a capacitor connected in series with said resistance element across said power supply, whereby said capacitor provides a substantially constant operating potential to said second stage during signal peaks of short duration when said second stage tends to draw a large current, and said resistance element operates to reduce the operating potential on said second stage when the current drawn thereby exceeds a predetermind value for a predetermined period.

2. The multi-stage transistor amplifier of claim 1, wherein said resistor is non-linear and comprises a tungsten filament lamp.

References Cited in the file of this patent

UNITED STATES PATENTS

| | | |
|---|---|---|
| 1,585,450 | Whelan | May 18, 1926 |
| 2,457,131 | Curtis | Dec. 28, 1948 |
| 2,678,391 | Lappin | May 11, 1954 |
| 2,784,262 | Crow | Mar. 5, 1957 |
| 2,794,076 | Shea | May 28, 1957 |
| 2,860,196 | Schultz | Nov. 11, 1958 |
| 2,884,545 | Houck | Apr. 28, 1959 |
| 2,918,629 | Bussard | Dec. 22, 1959 |

OTHER REFERENCES

Publication, Radio-Electronics, August 1957, pages 48–49, "Audio-High Fidelity," by Hamlin, B.